(12) United States Patent
Karim et al.

(10) Patent No.: US 8,316,840 B2
(45) Date of Patent: Nov. 27, 2012

(54) SHAPE MEMORY ALLOY MOTOR

(76) Inventors: Altaii Karim, Harrisonburg, VA (US); Thomas Benjamin, Powhatan, VA (US)

(*) Notice: Subject to any disclaimer, the term of this patent is extended or adjusted under 35 U.S.C. 154(b) by 231 days.

(21) Appl. No.: 12/583,464

(22) Filed: Aug. 22, 2009

(65) Prior Publication Data
US 2009/0315489 A1    Dec. 24, 2009

Related U.S. Application Data

(62) Division of application No. 11/236,695, filed on Sep. 27, 2005, now Pat. No. 7,692,091.

(51) Int. Cl.
  *F24J 2/54*    (2006.01)
  *F03G 7/06*    (2006.01)
  *H01L 31/00*    (2006.01)
  *H02N 11/00*    (2006.01)
  *F16H 1/16*    (2006.01)

(52) U.S. Cl. ..... 126/581; 126/605; 126/606; 192/48.92; 74/425; 60/527; 136/246

(58) Field of Classification Search ........... 310/306, 310/75 R, 83; 60/527–529; 74/89.14; 192/48.92; 353/3; 126/518, 605–606
See application file for complete search history.

(56) References Cited

U.S. PATENT DOCUMENTS

| | | | | |
|---|---|---|---|---|
| 3,636,781 A * | 1/1972 | Elliott | 74/125.5 |
| 3,725,835 A * | 4/1973 | Hopkins et al. | 337/140 |
| 4,044,752 A * | 8/1977 | Barak | 126/581 |
| 4,297,521 A * | 10/1981 | Johnson | 136/248 |
| 4,365,616 A * | 12/1982 | Vandenberg | 126/581 |
| 4,388,805 A * | 6/1983 | Rideout, Jr. | 60/527 |
| 4,424,802 A * | 1/1984 | Winders | 126/575 |
| 4,563,876 A * | 1/1986 | Banks | 60/527 |
| 4,628,142 A * | 12/1986 | Hashizume | 136/246 |
| 5,816,306 A * | 10/1998 | Giacomel | 160/6 |
| 5,921,083 A * | 7/1999 | Brotz | 60/528 |
| 6,019,113 A * | 2/2000 | Allston et al. | 137/1 |

* cited by examiner

*Primary Examiner* — Burton Mullins
(74) *Attorney, Agent, or Firm* — IPCL Group PLC; Anthony Tacconi

(57) ABSTRACT

The invention discloses a novel and efficient drive mechanism for use in a variety of applications. This novel mechanism replaces traditional stepper motors or another analogous art with shape memory alloys. The drive mechanism so disclosed provides substantial operational benefits over conventional motors and other such traditional drive mechanisms that would be used in similar applications. The drive mechanism includes a high gear-ratio worm gear and worm drive which further provides precise, controlled movement of an output shaft. In the illustrative use elaborated upon herein, the motor is used to drive a photovoltaic panel so that the panel may remain in appropriate alignment with the sun throughout the day.

11 Claims, 5 Drawing Sheets

SHAPE MEMORY ALLOY MOTOR

This application is a divisional application from U.S. application Ser. No. 11/236,695, filed Sep. 27, 2005, now U.S. Pat. No. 7,692,091 and claims priority from the foregoing application.

FIELD OF THE INVENTION AND RELATED ART

This invention relates to motor assemblies incorporating shape memory alloys, also known as SMAs. Drive mechanisms incorporating shape memory alloys are known in the art. These mechanisms utilize the shape altering properties of SMAs to effect required mechanical action.

SMA materials are particularly useful as they have the further capability of returning to their original pre-determined shape once the application of heat or electrical current is discontinued and the heat dissipates.

As an example, in a conventional solar tracking system, step motors are often used to drive the motion of solar collectors. In addition, there exist other, more passive, methods, such as the heating of fluids to shift the center of gravity of a rotating mount. On the whole, these techniques tend to be bulky, heavy, expensive, or unreliable, and may use a substantial amount of power. The present invention discloses a more efficient and precise drive mechanism which utilizes a shape memory alloy drive mechanism for motive power.

SUMMARY AND OBJECTS OF THE INVENTION

The present invention provides a motor driven by shape memory alloys for use in a variety of applications. Shape memory alloys, also known as SMAs or "smart materials", have the capability of altering their shape upon the application of heat or electrical current.

This invention provides a modular design, much like a step motor; it can be coupled with varied controls, including sensors or programmable controllers, and varied outputs depending on the required task. The current design is also unique in its ability to precisely and efficiently move relatively large masses.

The use of SMAs as actuators reduces the size and cost of the drive mechanism while maintaining precision and efficiency. Accordingly, it is an object of the invention to present a drive mechanism incorporating SMAs that may be used in a variety of applications, under any circumstances, that require a precise and efficient drive mechanism.

DETAILED DESCRIPTION OF THE PREFERRED EMBODIMENT

Figure 3:
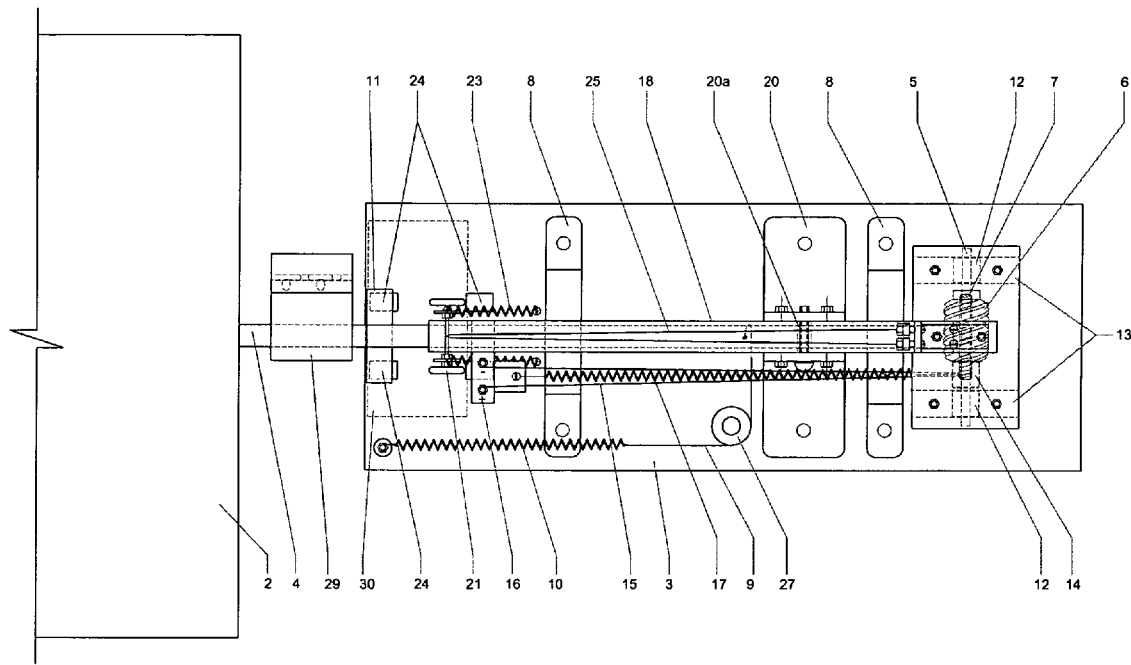
FIG. 3 is a front view of the tracker assembly.

Referring to FIG. 3, the drive mechanism disclosed includes at least one shape memory alloy actuator 15, 25, a spring 17, and at least two unidirectional bearings 12. The mechanism also includes a worm drive gear assembly comprising a worm gear 7, worm drive 6, drive shaft 5 and output shaft 4. The primary embodiment of the present invention is shown in conjunction with a solar tracking device. Use of the drive mechanism in conjunction with a solar tracking device is merely illustrative in order to demonstrate the basic mechanics of operation. The drive mechanism may be used in a variety of applications.

Figure 1:
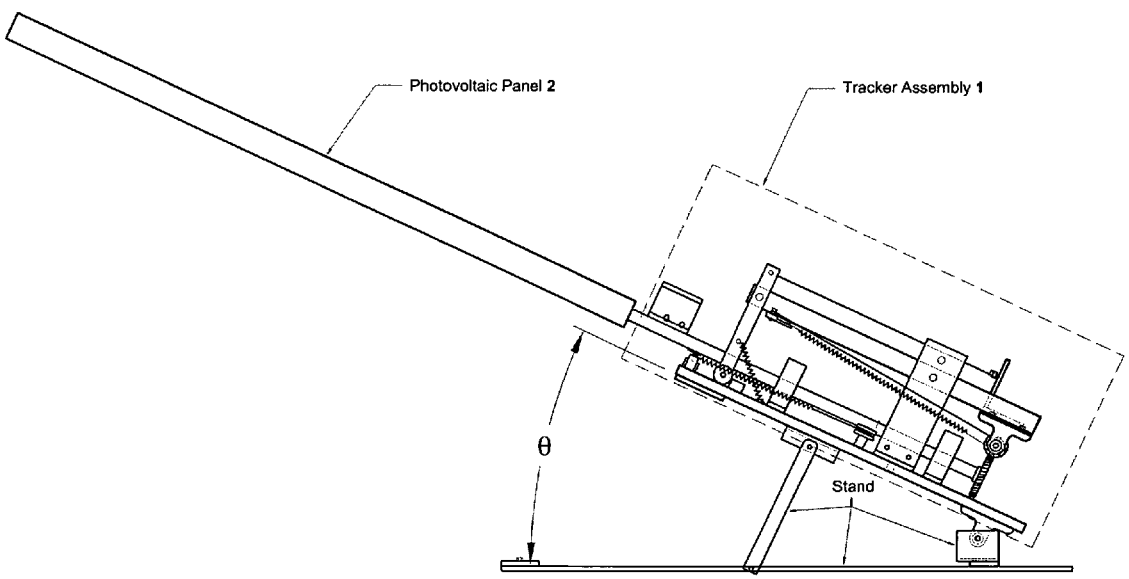
FIG. 1 is a side view of the tracker assembly with photovoltaic panel and stand.
Figure 2:
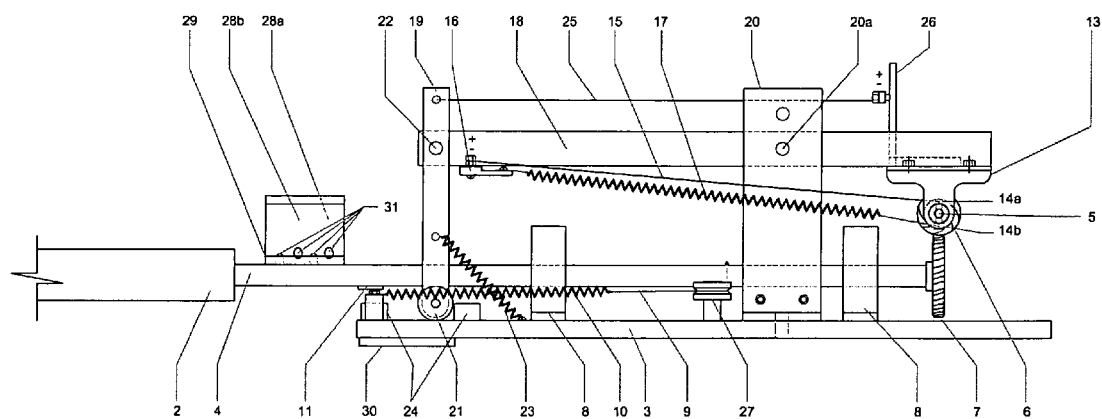
FIG. 2 is a side view of the tracker assembly.

Referring now to FIGS. 1, 2 and 3, the solar tracking device itself may be categorized as having three primary components: a tracking assembly 1, a photovoltaic panel 2, and a base platform 3. The photovoltaic panel 2 is disposed at the end of a rotatable output shaft 4, which in turn is driven in a forward motion by the forward motion drive assembly and in reverse by the disengagement assembly. The photovoltaic panel 2 and the tracking assembly, as a unit, are mounted on an adjustable stand that supports a base platform 3 that permits the adjustment and fixation of the zenith angle of the assembly.

Figure 4:
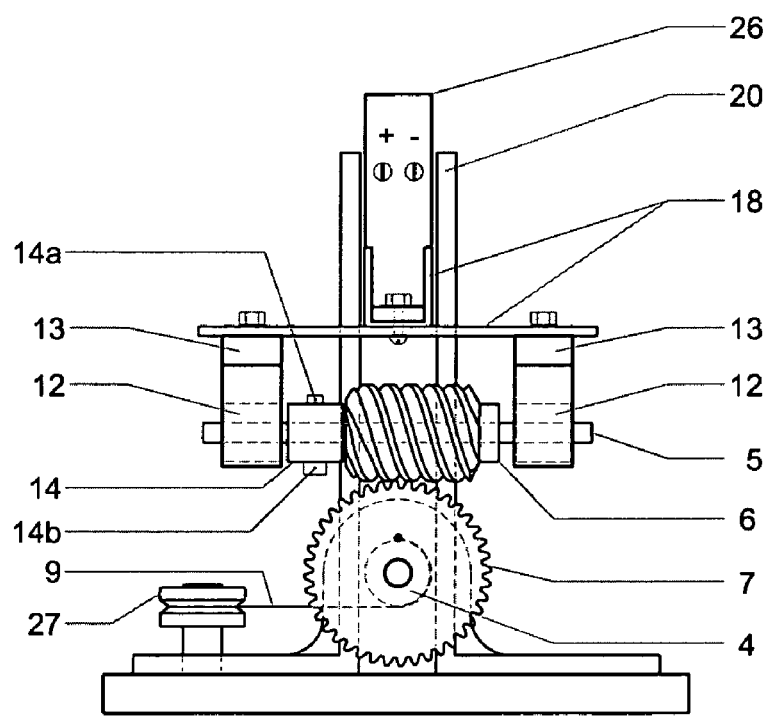
FIG. 4 is a partial bottom view of the tracker assembly showing the drive assembly.

The forward motion drive assembly shown in FIG. 4 includes a drive shaft 5 that engages an output shaft 4 through a coupled worm drive 6 and worm gear 7. The output shaft 4 is connected to the photovoltaic panel 2 and is supported by a pair of ball bearings 8 which support the weight of the output shaft 4 and the photovoltaic panel 2 while allowing the output shaft 4 to swivel. The output shaft 4 is engaged in two locations, namely, by the worm gear 7 mounted axially on the base of the shaft 4 and by a cable 9 attached to a return spring 10. An output shaft stopper 11 is also disposed on the output shaft 4 in order to prevent the output shaft 4, during return motion, from rotating beyond the predetermined start position.

The worm gear assembly is responsible for the movement of the output shaft 4 in the forward direction. In the northern hemisphere, a forward direction is from east to south to west. The worm gear assembly consists of the worm drive 6 and the worm gear 7. The worm drive 6 mounted on the drive shaft 5 engages the worm gear 7. The drive shaft 5 is supported by two unidirectional bearings termed backlash clutches 12. In the preferred embodiment, there is at least one such unidirectional bearing so as to prevent backlash while supporting the weight of the drive shaft 5. A second unidirectional bearing, known as the drive clutch 14, is also mounted on the drive shaft 5.

A forward actuator wire 15 is provided with one end of said wire attached to the drive clutch 14 at an attachment point 14a and the other end attached to a fixed mount, in this case the forward mounting plate 16. The forward actuator wire 15 is composed of a shape memory alloy (SMA). Although more than one type of SMA may be used, the most effective SMA in this embodiment would be a nickel titanium alloy. As will be appreciated by those skilled in the pertinent art, SMAs composed of other materials (e.g. copper zinc aluminum alloys) may be better suited for other applications, depending on the particular requirements of the application. The forward actuator wire 15 is positioned such that a contraction of the wire causes a rotation in the drive clutch 14. The forward actuator wire 15 is opposed by the forward spring 17 which is attached to a fixed mount 16 at one end and at attachment point 14b on the opposite end.

The entire forward motion drive assembly is mounted on one end of a rocking drive platform 18 which is pivotably connected to a locking arm 19. The drive platform 18 is further supported near its center by a platform pivot bracket 20. The platform pivot bracket having a portion defining a hole in which a platform pivot 20a is mounted.

The locking arm 19 is provided with locking arm rollers 21 in contact with the fixed base platform 3 which permit the locking arm 19, when not locked into place, to remove the lock and pivot the drive platform 18 around the platform pivot 20a. The Locking Arm 19 is pivotable about the arm pivot 22. The locking arm 19 is held by two symmetrical engagement springs 23 that generate a single force which performs multiple functions. The force generated by the springs 23 holds the locking arm rollers 21 down against the base platform 3 while forcing the gears 6 and 7 together by pulling the locking arm 19 into the locked position between the drive platform 18 and the base platform 3. Arm stoppers 24 are provided so as to limit the angle of rotation of the locking arm 19 in either direction. The drive platform 18 is pivotably connected to the platform pivot bracket 20 which supports the drive platform 18 while allowing movement around the platform pivot 20a when the gears 6, 7 are to be disengaged or re-engaged.

A disengagement actuator 25, composed of an SMA wire, is attached at one end to the drive platform 18, or a mounting plate 26 attached to said drive platform, and at the other to a point on the locking arm 19, such that a contraction of the disengagement actuator 25 would rotate the locking arm 19 and stretch the engagement springs 23 thereby disengaging the gears 6, 7. A return spring 10 is provided having one end attached to a point on the fixed base platform 3 and the other end attached to the return spring cable 9. The return spring cable 9 stretches from the return spring 10, through the return spring pulley 27, and is attached to the output shaft 4.

Figure 5:
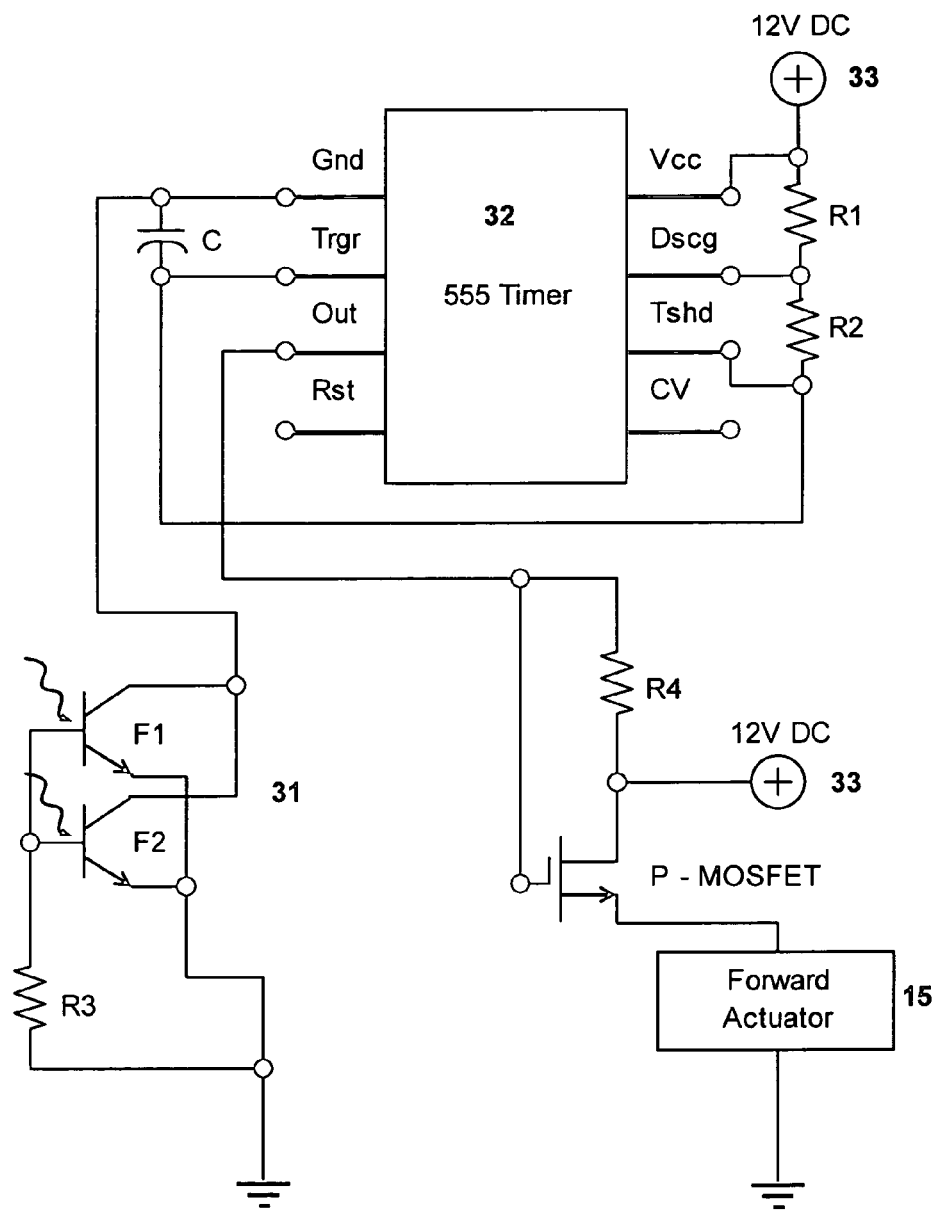
FIG. 5 is a schematic of the sensor circuit for controlling forward movement of the device.

The movement of the actuators is controlled through the use of an analog sensing circuit 30. Referring now to FIG. 5, in the primary embodiment, different phototransistors 31 are used to activate separate parts of the circuit in order to control the different directions of motion. A 555-timer 32 is provided to control another transistor, the P-MOSFET, that allows current to flow from the battery 33 to the actuation wires 15, 25.

When electric current is applied to the forward actuator 15, the actuator contracts to apply torque to the drive clutch 14. Accordingly, the drive clutch 14 is rotated in the "slip" direction by the forward actuator 15. The forward spring 17 torques the drive clutch 14 in the opposite direction as the forward actuator 15 cools. With each cycle of the forward actuator 15, the drive shaft 5 and worm 6 are rotated which results in the turning of the worm gear 7 and output shaft 4.

As the photovoltaic panel 2 is advanced throughout the day, the return spring 10 is slowly stretched, providing an opposing force to the forward motion while storing mechanical energy to be used later in the return motion. The torque from the return spring 10 on the output shaft 4 is in the opposite direction of the torque supplied by the worm drive 6. When the output shaft 4 (which holds the photovoltaic panel 2) is signaled to return to the start position, the worm 6 and worm gear 7 are separated so that the output shaft 4 is no longer locked in place. Once the output shaft 4 is free to swivel on the support bearings 8, the return spring 10 rotates the shaft 4 in the reverse direction until blocked by a mechanical stopper 11, resetting the photovoltaic panel 2 to the sunrise position. The drive platform 18 can pivot away to disengage the gears 6, 7 and then return for re-engagement. Under normal operation, this happens once per day. While engaged, the drive platform 18 is locked into place with a rigid locking arm 19. After the panel 2 has completed its rotation with the sun for the day, the unlocking is accomplished with a disengagement actuation wire 25 that contracts to pull on the locking arm 19, working against the pair of engagement springs 23 to remove the lock and pivot the drive platform 18 away from the worm gear 7 thereby disengaging the worm drive 6 and the worm gear 7. As the disengagement actuator 25 cools, the engagement springs 23 pull the locking arm 19 back into the locked position.

The ratio between the worm 6 and worm gear 7 may be specifically selected based upon the intended use of the motor, thereby allowing the assembly to be modified in order to maximize efficiency based upon particular operational conditions. With a low gear ratio, the forward actuator 15 must pull with more force, but over a smaller distance. With a higher ratio, the forward actuator 15 is given a mechanical advantage, and can take more precise (though more frequent) steps. This inverse balance between force and displacement can be fine-tuned by adjusting the leverage in a number of different places in the system. For example, the lengths of the pivoting drive platform 18 and locking arm 19 can be varied. Also, the diameters of the drive clutch 14 and output shaft 4 act as lever arms for the forward actuator 15 and return spring 10 respectively. Likewise, the forward actuator 15 might be shorter with a larger diameter to provide a larger force over a smaller distance, or it might be longer and thinner for a smaller force over a greater distance. With a higher gear ratio, the potential effects of backlash are reduced, thereby minimizing any wasted motion in each forward cycle. For example, with a given output angle per cycle, a higher gear 6, 7 ratio will require a greater angle of movement in the drive shaft 5. As the drive clutch 14 is rotated through a larger angle, a smaller portion of each cycle is lost to play. By using a worm 6 and worm gear 7, not only are high ratios easily achieved, but the output shaft 4 is also effectively locked in place from external forces on the photovoltaic panel 2 such as wind or vibration.

The use of a motor assembly with shape memory alloys reduces the size and cost of the drive mechanism. Specifically, the use of a nickel titanium alloy in the shape of a wire 15, 25 acts as a mechanical muscle, with one "contracting" stroke and one "stretching" stroke in each cycle. The contraction is accomplished when the actuator is heated above the threshold temperature. Heat can be applied to the wire in any number of ways, but in this device, an electric current is passed directly through the resistive actuator in order to raise its temperature. When the current stops, the actuator cools and stretches back to its original length under some opposing force. In a preferred embodiment, each stroke causes a displacement of 3 to 4% of the length of the wire, and the cycle can be reliably repeated millions of times. It will be noted that a greater displacement may be achieved by utilizing a SMA component in the shape of a spring but such an application would also serve to reduce the overall efficiency of the system.

The drive assembly was designed to operate such that the faster contraction stroke of the forward actuator 15 moves the drive clutch 14 in the slip direction, while the slower relaxing stroke moves the drive clutch 14 in the drive direction. Therefore, the forward spring 17 is providing the force that actually moves the photovoltaic panel 2 against the force of the return spring 10 (and any external forces such as wind), so the forward actuator 15 is working against the forward spring 17 alone. This provides two important benefits in the preferred embodiment. First, by utilizing the slower, cooling stroke to move the photovoltaic panel, dynamic effects of acceleration, momentum, and inertia are minimized. Specifically, upon crossing the temperature threshold, the actuator 15 contracts with a quick jerking motion, whereas the cooling stroke is slow and controlled. Second, by isolating the contraction stroke against the return spring 10, the dynamic force profile of each stroke remains very consistent for the actuator 15, enhancing the reliability and lifespan of the actuator 15.

Referring now to FIG. 5, the simplest method of controlling the movement of the motor in this particular embodiment is through an analog sensing circuit 30. There must be at least one sensor for each direction of motion. In this design, different phototransistors 31 are used to turn on separate parts of the circuit 30 to control the different directions of motion. Multiple phototransistors can be used for each direction of motion by connecting them in parallel. The light-sensitivity of these phototransistors can be adjusted by changing the value of the resistor R3. Once a phototransistor activates the circuit, a 555-timer 32 controls another transistor that allows current to flow from a battery 33 to one of the actuation wires 15 or 25. The timer is used to convert a continuous "on" signal from the phototransistor to a cyclic "on-off" signal, allowing the actuator to heat and cool repeatedly. The necessary "on-time" and "off-time" are determined by the size of the actuation wire and power source, and can be adjusted to the correct duration by the values of two resistors R1, R2 and one capacitor C that are connected to the timer 32. Also, the timer 32 itself receives no power without a signal from one of the phototransistors 31 (because of a break in the ground line) in order to minimize overall power consumption. In the primary embodiment, the current is drawn from a battery 33 that has been charged by the photovoltaic panel 2, but it will be recognized that the power could also come from a photovoltaic panel directly, a bank of capacitors, an alternating current line, or any other electric power supply.

When the timer 32 is not grounded, it consumes no power, and the P-MOSFET breaks the circuit to the actuator 15 so that no movement can happen. If F1 or F2, or both, receive light, then the timer 32 becomes grounded and begins to count (by charging and discharging the capacitor C through R1 and R2). Once the timer 32 has completed the first period of its two-step cycle, it toggles the output signal to close the P-MOSFET, allowing current to flow from the battery 33 (or photovoltaic panel, capacitor bank, AC, or any other power supply), through the P-MOSFET, then the actuator, to the ground. This heats the actuator, causing it to contract. When the timer has finished the second period of its cycle, the output of the timer is toggled once again, so the P-MOSFET breaks the circuit, allowing the actuator to cool and stretch. If the previous cycle did not rotate the output shaft 4 far enough, then the forward sensors will still be in the light, and the cycle continues until they are shaded. When all the sensors are shaded, the timer ground is broken so no further action is taken. The backward part of the circuit works exactly the same way. It is identical in form, but may have different values for C, R1, or R2 (for timing purposes), has physically different sensor positions and orientations, and a distinct actuator 25 which may differ in size from the forward actuator 15. It will be recognized by those in the art that other controller types, including digital circuits, may be used to accomplish the foregoing tasks.

Although the shape memory drive mechanism has thus far been described in relation to a solar tracking device, this device can be used as a modular step-motor for many applications outside of solar power. The shape memory alloy actuators are small, light-weight, inexpensive, reliable, quiet, and efficient.

The primary embodiment disclosed herein fits the solar power application because only the forward direction requires precision, while the return movement can be taken as a single leap. Also, multiple output revolutions are never needed. However, if precise motion were required in both directions, the same principle could be used, but with a gear shifting, relying upon more than one worm gear assembly, rather than disengaging, allowing the same "forward drive" to work in the opposite direction as well.

The sensing circuit 30 discussed in the photovoltaic application can be replaced with a programmable microprocessor. This inexpensive control can be very robust, and can work with a variety of inputs, such as programs or other sensors, to execute any number of different tasks. For increased speed, the drive shaft 5 can be fitted with multiple drive clutches, each with its own actuator/spring pair, working in a sequenced wave like pistons in a combustion engine. For increased strength, the forward actuator 15 size can be increased. Thicker actuators will pull with more force, and longer actuators will pull a greater distance. Therefore, longer actuators can be used for a greater angle of rotation in the drive shaft 5, or they can be mounted on a drive clutch with a larger diameter to turn the shaft 4 over the same angle, but with greater force. When using a worm 6 and worm gear 7 with a high gear ratio, extremely precise movements can be obtained, with steps of a fraction of a degree, packaged in a small modular case much like a traditional electromagnetic step motor. It will also be noted that the relative positions of the actuator(s) and spring(s) could be reversed allowing the motor to drive with the faster contracting stroke rather than as operated in the embodiments set forth thus far.

The driving mechanism can be used in other applications besides solar tracking. It can be used in place of a motor for any low-speed or light-duty application. This mechanism can be customized to track many physical phenomena (that can be sensed by a sensor or a detector). Examples include: light source (different spectrum within), radio signals, motion, wind, sound, magnetic field, chemical and biological agents, etc on earth and possibly in outer space.

While the invention has been described in reference to certain preferred embodiments, it will be readily apparent to one of ordinary skill in the art that certain modifications or variations may be made to the system without departing from the scope of invention claimed below and described in the foregoing specification.

We claim:

1. A drive mechanism incorporating shape memory alloy actuators comprising:
   A motor comprising at least one shape memory alloy actuator, a drive shaft and at least two unidirectional bearings operating in the same direction; at least one spring attached to one of the at least two unidirectional bearings; said unidirectional bearings allowing said drive shaft to travel in only one direction;
   A worm gear fixed to an output shaft; and
   A worm drive mounted on said drive shaft wherein said worm drive engages said worm gear to transmit the rotational force of the motor to the worm gear and therethrough to said output shaft.

2. The device as in claim 1 further comprising a means for controlling the operation of said motor.

3. The device as in claim 2 wherein said means for controlling the operation of said motor comprises an analog circuit.

4. The device as in claim 3 wherein said analog circuit includes at least one resistor and at least one capacitive device.

5. The device in claim 3 wherein said analog circuit regulates or controls at least one of the following variables of said motor: voltage, current, duration of current flow, or number of cycles of current flow.

6. The device as in claim 3 further comprising at least one phototransistor; said analog circuit electrically connected to said phototransistor whereby said phototransistor may transmit electrical signals to said analog circuit.

7. The device in claim 3 wherein said analog circuit includes a P-type metal oxide semiconductor field effect transistor.

8. The device as in claim 2 wherein said means for controlling the operation of said motor comprises a microprocessor.

9. A drive mechanism incorporating shape memory alloy actuators comprising:
   a shape memory alloy actuator;
   a first unidirectional bearing attached to one end of said shape memory alloy actuator;
   at least one spring attached to said first unidirectional bearing;
   a drive shaft;
   a second unidirectional bearing allowing rotation of the drive shaft in only one direction;
   a worm gear fixed to an output shaft; and
   a worm drive mounted on said drive shaft,
   whereby said worm drive engages said worm gear to transmit force to the worm gear and therethrough to said output shaft.

10. The drive mechanism of claim 9 further including a third unidirectional bearing operating on said drive shaft and allowing rotation of the drive shaft in only one direction.

11. A drive mechanism incorporating shape memory alloy actuators comprising:
   a worm gear assembly,
   a drive shaft engaging said worm gear assembly;
   a backlash bearing comprising at least one unidirectional bearing mounted on said drive shaft;
   said backlash bearing permitting said drive shaft to rotate in only one direction; and
   at least one drive assembly, said drive assembly comprising at least one unidirectional bearing mounted on said drive shaft, at least one shape memory actuator engaging said at least one unidirectional bearing of said drive assembly, and at least one spring engaging said at least one unidirectional bearing of said drive assembly;
   whereby contraction of said at least one shape memory actuator in said at least one drive assembly rotates said at least one unidirectional bearing in said drive assembly in a first direction and contraction of said spring rotates said at least one unidirectional bearing in said drive assembly in a second direction which results in the transmission of force to said worm gear assembly.

* * * * *